(12) United States Patent
Iwata et al.

(10) Patent No.: US 8,009,427 B2
(45) Date of Patent: Aug. 30, 2011

(54) IMAGE DISPLAY APPARATUS

(75) Inventors: Yukihiro Iwata, Osaka (JP); Shinya Ogasawara, Hyogo (JP); Takayuki Furukawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/645,852

(22) Filed: Dec. 23, 2009

(65) Prior Publication Data
US 2010/0165574 A1 Jul. 1, 2010

(30) Foreign Application Priority Data

Dec. 26, 2008 (JP) ................... 2008-334464

(51) Int. Cl.
*H05K 7/20* (2006.01)
(52) U.S. Cl. .............. 361/699; 361/679.46; 361/679.53; 361/698; 165/104.33
(58) Field of Classification Search .................. None
See application file for complete search history.

(56) References Cited

U.S. PATENT DOCUMENTS

| 6,530,420 | B1 * | 3/2003 | Takada et al. ............ 165/104.33 |
| 6,556,439 | B2 * | 4/2003 | Shibasaki ................ 361/679.52 |
| 6,795,312 | B2 * | 9/2004 | Narakino et al. ......... 361/679.53 |
| 7,042,724 | B2 * | 5/2006 | Löcker ............................ 361/699 |
| 7,502,227 | B2 * | 3/2009 | Uchida et al. ............ 361/679.48 |
| 7,624,789 | B2 * | 12/2009 | Minamitani et al. ...... 165/104.33 |
| 7,791,876 | B2 * | 9/2010 | Moore et al. ............. 361/679.53 |
| 2004/0042171 | A1 | 3/2004 | Takamatsu et al. |

FOREIGN PATENT DOCUMENTS

| JP | 2-153317 A | 6/1990 |
| JP | 5-121005 A | 5/1993 |
| JP | 2000-040474 A | 2/2000 |
| JP | 2003-324174 A | 11/2003 |

* cited by examiner

*Primary Examiner* — Boris Chervinsky
(74) *Attorney, Agent, or Firm* — Hamre, Schumann, Mueller & Larson, P.C.

(57) ABSTRACT

An image display apparatus of the present invention includes: a display device for displaying an image; a heat-receiving tube that is disposed so as to be in thermal communication with the display device and is filled with a cooling liquid; a heat-radiating tube that is provided to be continuous with the heat-receiving tube and is filled with the cooling liquid; and a transporting pump allowing the cooling liquid to circulate through the heat-receiving tube and the heat-radiating tube. When viewed from a display surface side of the display device, at least a part of the heat-radiating tube is located outside a peripheral edge of the display device and is disposed along the peripheral edge.

1 Claim, 5 Drawing Sheets

IMAGE DISPLAY APPARATUS

BACKGROUND OF THE INVENTION

1. Field of the Invention

The present invention relates to an image display apparatus for displaying images such as television images.

2. Description of Related Art

In recent years, image display apparatuses for displaying images, such as television images, have become thinner. Accordingly, for the image display apparatuses, flat panel displays (hereinafter referred to as FPDs) using a flat-type display panel, such as a plasma display panel (hereinafter referred to as a PDP) and a liquid crystal panel, have become a mainstream instead of the CRTs (cathode-ray tubes) of the past.

For example, since the plasma displays using the PDP display images by utilizing the gas discharge caused in the PDP, they have the characteristics that the PDP tends to have a high temperature easily during operation. The high temperature of the PDP changes the electric capacity of the electrode formed in the PDP, causing adverse effects such as normal discharge not being performed. Thus, in the case of using a plasma display, it is necessary to radiate heat generated in the PDP and maintain the interior of the PDP within a predetermined temperature range.

Conventionally, various types of radiation structures have been proposed in order to radiate the heat generated in the display panel such as the PDP. Generally, PDPs employ an air-cooling-type radiation structure in which a cooling fan allows air to flow between the PDP and a chassis so as to lower the PDP temperature (see JP 2000-040474 A, for example).

However, in the air-cooling-type radiation structure as mentioned above, the heat transfer from the display panel to air is insufficient, and it is likely to be impossible to deal with the amount of heat increasing due to the further reduced thickness and increased luminance of the FPD.

Also, the amount of heat generated during operation tends to increase rapidly in electronic apparatuses, such as portable computers, due to their higher processing speed and multi-functionalization. As a result, the air-cooling-type cooling system using a conventional motor-driven fan cannot deal with such heat any more, and it is proposed to use a liquid-cooling-type cooling system using a cooling liquid having a specific heat higher than that of air. For example, JP 2003-324174 A discloses a structure in which a liquid-cooling-type cooling unit radiates the heat generated in a high-heat-generating component (central processing unit) of an electronic apparatus.

With reference to FIG. 8, an example of electronic apparatuses with the radiation structure utilizing the liquid-cooling-type cooling system will be described.

A portable computer 101, which is an example of the electronic apparatuses, is constituted by a main body 102 and a display unit 103. The portable computer 101 includes a liquid-cooling-type cooling unit for cooling a semiconductor package 104 that is a high-heat-generating component. The cooling unit includes a heat-receiving head 105 serving as a heat receiving portion disposed in the main body 102, a radiator 106 serving as a radiating portion disposed in the display unit 103, and a circulation passage 108 for allowing a cooling liquid to circulate between a refrigerant passage (not shown) of the heat-receiving head 105 and a refrigerant passage 107 of the radiator 106. The heat generated in the semiconductor package 104 is absorbed by the cooling liquid in the refrigerant passage of the heat-receiving head 105. The cooling liquid that flows through the heat-receiving head 105 and has absorbed the heat is pumped into the radiator 106 disposed on a display unit 103 side by using a centrifugal pump 109. The refrigerant passage 107 of the radiator 106 is disposed so as to follow a meandering path between a rear surface of a display panel (not shown) and a housing 110. The cooling liquid is cooled by the heat exchange occurring when it passes through the radiator 106. The cooling liquid cooled in the radiator 106 is returned to the refrigerant passage of the heat-receiving head 105 via the circulation passage 108. Repetition of this cycle allows the heat generated on a main body 102 side to be radiated to the display unit 103 side.

In addition, as an example of the FPD utilizing the liquid-cooling-type cooling unit, there has been proposed a radiation structure in which a cooling layer into which the cooling liquid has been poured is provided on a rear surface of a liquid crystal display panel, and heat radiating fins disposed so as to surround the cooling layer radiate the heat that the cooling layer has received (see JP 2(1990)-153317 A).

There also has been proposed a radiation structure in which an airtight casing formed between a display surface of a PDP and a front panel is provided on a display surface side of the PDP, and the cooling liquid filling the airtight casing cools the heat generated in the PDP (see JP 5(1993)-121005 A). This structure includes a convection tube connecting an upper portion and a lower portion of the airtight casing via a rear surface of the PDP. A heat sink is formed somewhere in the convection tube. The heat generated in the PDP is transferred to the cooling liquid contained in the airtight casing, and then is transferred from the convection tube to the heat sink by convection so as to be radiated outside.

However, in the radiation structure proposed in JP 2003-324174 A as a cooling system for electronic apparatuses, the heat is radiated by allowing the cooling liquid that has received the heat generated on the main body 102 side to pass through the refrigerant passage 107 disposed between the rear surface of the display panel and the housing 110 (see FIG. 8). Thus, applying this radiation structure to an image display apparatus, such as a plasma display, requires a flow passage for achieving sufficient heat radiation to be provided in a rear surface region of the display device of the image display apparatus. This thickens the image display apparatus and makes it difficult to reduce the thickness of the apparatus.

Furthermore, in accordance with the thickness reduction to be accelerated further in the future, a gap between the display device of the image display apparatus and the rear housing is reduced, and the temperature of the housing behind the display device rises. This makes it difficult to utilize the rear surface region of the display device as a heat radiating portion.

In the radiation structure disclosed in JP 2(1990)-153317 A, a space to be filled with the cooling liquid is needed in a thickness direction all over the panel, increasing the thickness of the unit. Moreover, since the cooling liquid is circulated by natural convection, reducing the thickness of this portion makes it difficult for the cooling liquid to circulate, lowering the efficiency in radiating heat. As a result, thickness reduction using this radiation structure is difficult. Also in the radiation structure disclosed in JP 5(1993)-121005 A, a space to be filled with the cooling liquid is needed in a thickness direction all over the panel, increasing the thickness of the unit. Since this radiation structure requires the space to be large enough to allow the cooling liquid to circulate, it is difficult to make this portion extremely thin. Accordingly, thickness reduction using this radiation structure is difficult. As a result, it is likely to be difficult to apply these structures to image display apparatuses that generate an increasing amount of heat and are required to be further thinner in the future.

As mentioned above, there conventionally have been no effective means for applying the liquid-cooling-type cooling system to image display apparatuses, and it has been difficult to deal with the amount of heat increasing due to the further reduced thickness and increased luminance.

SUMMARY OF THE INVENTION

An object of the present invention is to provide a thinner image display apparatus that utilizes a liquid-cooling-type cooling system capable of efficient heat radiation.

The above-mentioned object is attained by the following image display apparatus.

The image display apparatus includes: a display device for displaying an image; a heat-receiving tube that is disposed so as to be in thermal communication with the display device and is filled with a cooling liquid; a heat-radiating tube that is provided to be continuous with the heat-receiving tube and is filled with the cooling liquid; and a transporting pump allowing the cooling liquid to circulate through the heat-receiving tube and the heat-radiating tube. When viewed from a display surface side of the display device, at least a part of the heat-radiating tube is located outside a peripheral edge of the display device and is disposed along the peripheral edge.

Since the image display device utilizes a liquid-cooling-type cooling system, it can radiate heat more efficiently than conventional image display apparatuses utilizing an air-cooling-type cooling system. Furthermore, in the image display apparatus, the at least a part of the heat-radiating tube is disposed in a region outside the peripheral edge of the display device. This region has a lower temperature than that of a rear portion of the display device, in which a temperature rises sharply during operation due to the reduced thickness of the apparatus. Accordingly, utilization of the region enables efficient heat radiation. Thus, even when the thickness of the apparatus is reduced, the structure of the image display apparatus makes it possible to radiate the heat that the cooling liquid has received from the display device and a circuit board via the heat-receiving tube to the outside of the image display apparatus effectively. Furthermore, since the structure of the image display apparatus allows such an effective heat radiation, it is neither necessary to increase the length of a cooling liquid flow passage in order to ensure a sufficient amount of heat radiation nor to ensure the thickness of the image display apparatus in order to dispose the cooling liquid flow passage with the increased length.

As described above, the image display apparatus can be thinner while utilizing the liquid-cooling-type cooling system capable of efficient heat radiation.

DETAILED DESCRIPTION OF THE INVENTION

Hereinafter, embodiments of the present invention will be described with reference to the drawings. The following embodiments are examples and the present invention is not limited to the following embodiments. Furthermore, in the following embodiments, the same parts may be indicated with identical numerals and the same descriptions thereof may be omitted.

Embodiment 1

Embodiment 1 describes an example of the configuration of the present invention, referring to a plasma display as an example of the image display apparatus.

Figure 1:
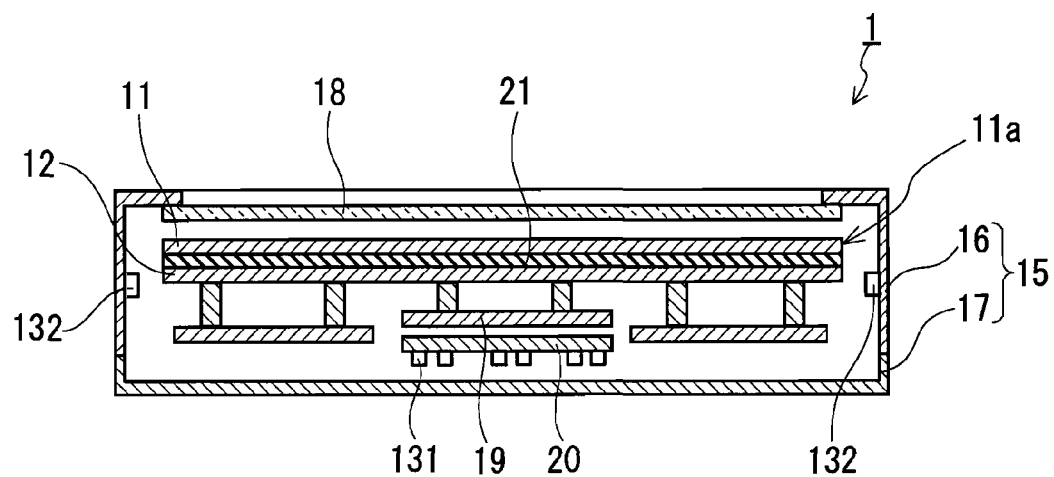
FIG. 1 is a cross-sectional view of an image display apparatus of Embodiment 1 of the present invention, which has been cut perpendicularly with respect to a display surface of a display device, at the middle along a horizontal direction.
Figure 2:
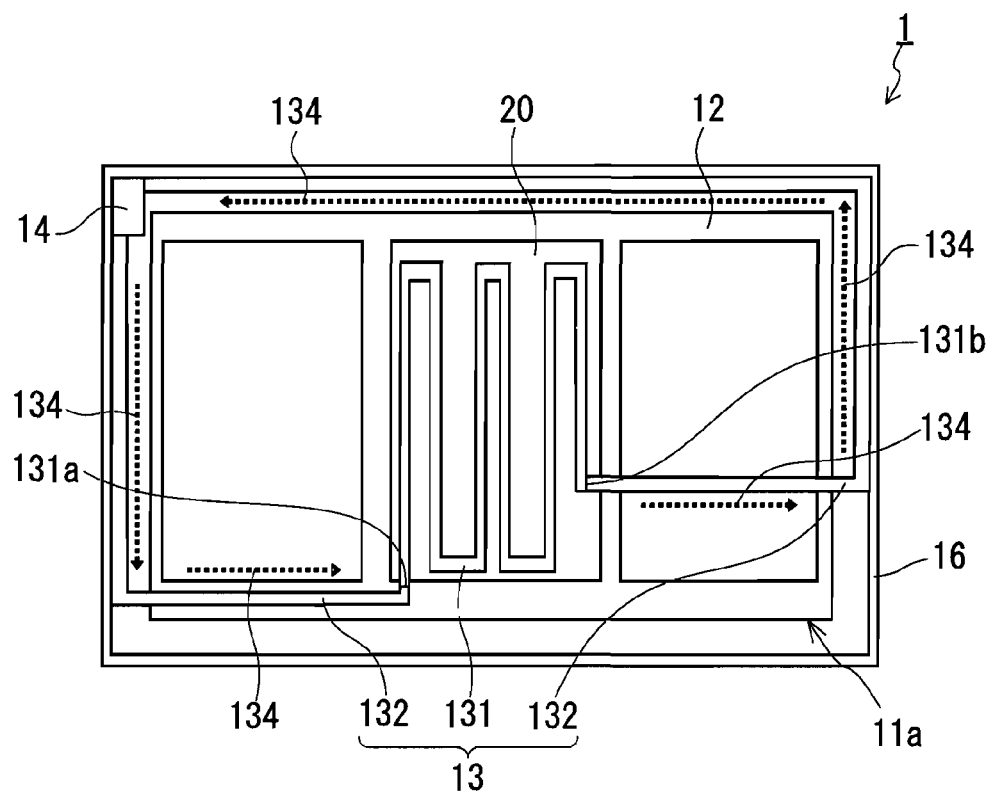
FIG. 2 is a rear view of the image display apparatus of the Embodiment 1 of the present invention.

FIG. 1 is a cross-sectional view of an image display apparatus 1 of the present embodiment, which has been cut perpendicularly with respect to a display surface of a PDP (display device) at the middle along a horizontal direction. FIG. 2 is a rear view of the image display apparatus 1 of the present embodiment from which a back cover is omitted. In this specification, the horizontal direction of the image display apparatus means a horizontal direction when the image display apparatus is disposed normally, and a vertical direction of the image display apparatus means a vertical direction when the image display apparatus is disposed normally. Usually, a long side direction of the PDP is parallel to the horizontal direction, and a short side direction of the PDP is parallel to the vertical direction. In this specification, the display surface of the PDP may be called a front surface, and a surface of the PDP opposite to the display surface may be called a rear surface.

As shown in FIG. 1 and FIG. 2, the image display apparatus 1 of the present embodiment includes a PDP (display device) 11, a chassis 12 for supporting the PDP 11, a tube 13 serving as a circulation passage for a cooling liquid, a transporting pump 14 for allowing the cooling liquid to circulate through the tube 13, a housing 15, a front filter 18 disposed on a front surface side of the PDP 11, a circuit board 19 such as a driving circuit board and a power supply circuit board, a heat-radiating plate 20 disposed so as to face the circuit board 19, and a heat-conducting sheet 21 provided between the PDP 11 and the chassis 12. The tube 13 is constituted by a heat-receiving tube 131 and a heat-radiating tube 132. The heat-receiving tube 131 is disposed so as to be in contact with the heat-radiating plate 20, and is in thermal communication with the PDP 11 and the circuit board 19, both of which are self-heating members, via the heat-radiating plate 20. When viewed from a display surface side of the PDP 11, substantially the entire heat-radiating tube 132 is located outside a peripheral edge 11a of the PDP 11 and is disposed along the peripheral edge 11a. The housing 15 is constituted by a front cover 16 and a back cover 17. The phrase "substantially the entire heat-radiating tube 132 is located outside a peripheral edge 11a of the PDP 11 and is disposed along the peripheral edge 11a" means that 50% or more of, preferably 70% or more of the total length of the heat-radiating tube 132 is located outside the peripheral edge 11a of the PDP 11 and is disposed along the peripheral edge 11a. From another aspect, the entire heat-radiating tube 132 except for a portion to be coupled to the heat-receiving tube 131 is located outside the peripheral edge 11a of the PDP 11 and is disposed along the peripheral edge 11a.

Hereinafter, each component of the image display apparatus 1 will be described.

The PDP 11 is a display device for displaying images. Components of the PDP 11 specifically will be described below, which are not illustrated in FIG. 1 and FIG. 2.

The PDP 11 has a front glass substrate and a rear glass substrate. A plurality of display electrode pairs, each constituted by a scanning electrode and a sustaining electrode both parallel to a first direction, are formed on the front glass substrate. A plurality of address electrodes parallel to a second direction intersecting with the first direction are formed on the rear glass substrate. The display electrode pairs are covered with a dielectric layer. The dielectric layer is covered with a protective layer formed of MgO, etc. Red, blue, and green phosphors are applied to the rear glass substrate. The front glass substrate and the rear glass substrate are bonded to each other. The largest faces of the front glass substrate and the rear glass substrate are in the shape of a rectangle. The PDP 11 is disposed so that a long side direction of the rectangle corresponds to the first direction and usually is in the horizontal direction. Also, the PDP 11 is disposed so that a short side direction of the rectangle corresponds to the second direction and usually is in the vertical direction. The front glass substrate and the rear glass substrate each have a thickness of approximately 1.5 mm to 3 mm.

When viewed from the front surface side, a portion that is at a location where the display electrode pair and the address electrode intersect with each other and is sandwiched between the display electrode pair and the address electrode is called a discharge cell. One of the red, blue, and green phosphors is applied to the discharge cell. The discharge cell is filled with a discharge gas containing a rare gas such as helium (He), neon (Ne), and xenon (Xe). A voltage is applied to the display electrode pair and the address electrode to cause a discharge in the discharge cell so as to generate an ultraviolet ray. The phosphor is excited by the generated ultraviolet ray and emits light to display an image.

Specifically, an initialization discharge is performed first in which a voltage is applied to all lines of the scanning electrodes to cause a discharge in all of the discharge cells. Next, a voltage is applied to the scanning electrodes sequentially, and a voltage is applied also to the address electrode intersecting with the discharge cell that is intended to emit light on the voltage-applied scanning electrode. This is called an address discharge, by which the discharge cell at a location where the voltage-applied scanning electrode and the voltage-applied address electrode intersect with each other emits light, and the discharge cell is selected as a light-emitting cell. Then, a sustain discharge is performed in which an alternating voltage is applied between the scanning electrode and the sustaining electrode. The sustain discharge allows only the previously selected light-emitting cell to emit light, and thereby the PDP 11 displays an image.

When the PDP 11 displays an image by causing a discharge in the discharge cell, the PDP 11 tends to have a high temperature easily. The PDP 11 with a high temperature has problems, for example, in that discharge properties thereof are changed and the PDP 11 tends to have a discharge error such that the discharge cell supposed to emit light does not emit light, and the discharge cell not supposed to emit light does emit light, resulting in lower quality in displaying images. In addition, the PDP 11 with a high temperature has problems such as cracks in the front glass substrate and the rear glass substrate. In order to suppress the occurrence of these problems, it is important to release efficiently the heat generated in the PDP 11 to the outside and limit the temperature of the PDP 11 to 70° C. to 80° C., for example.

Next, the chassis 12 will be described. The chassis 12 is a member for supporting the PDP 11. The chassis 12 is composed of a metal plate, such as an aluminum plate and a copper plate, that has high thermal and electric conductivities. The chassis 12 is designed so that the largest face thereof has a size almost equal to sizes of the largest faces of the front glass substrate and the rear glass substrate of the PDP 11, and the chassis 12 has a thickness of approximately 1.5 mm to 4 mm. The chassis 12 may be provided with a bent portion for reinforcement or a reinforcing rib, as needed. The chassis 12 supports the PDP 11 with one surface (a front surface) thereof. The PDP 11 is attached to the front surface of the chassis 12 via the heat-conducting sheet 21. The circuit board 19, such as a driving circuit board and a power supply circuit board, is attached to another surface (a rear surface) of the chassis 12 so as to be almost parallel to the rear surface of the chassis 12.

The chassis 12 functions as a heat radiating member absorbing the heat generated in the PDP 11 and the circuit board 19 and releasing the heat to the air and other members. The chassis 12 functions also as a reinforcing member that supports the PDP 11 and the circuit board 19 to maintain their strengths. Furthermore, the chassis 12 functions also as an electric ground for the PDP 11, the circuit board 19, etc.

Next, the tube 13 will be described. As mentioned above, the tube 13 is constituted by the heat-receiving tube 131 and the heat-radiating tube 132.

The heat-receiving tube 131 of the tube 13 is a portion that is in thermal communication with the self-heating members such as the PDP 11 and the circuit board 102, and has a function of transferring the heat from the high temperature self-heating members to the low temperature cooling liquid to lower the temperatures of the self-heating members.

On the other hand, the heat-radiating tube 132 of the tube 13 is a portion that is not in thermal communication with the self-heating members. The heat-radiating tube 132 transfers the heat of the cooling liquid whose temperature has been increased in the heat-receiving tube 131 to an atmosphere by radiation, or transfer the heat to the housing 15 with which the heat-radiating tube 132 is in contact by conduction.

Hereinafter, arrangements of the heat-receiving tube 131 and the heat-radiating tube 132 will be described along the flow of the cooling liquid.

The heat-receiving tube 131 includes a heat receiving portion inlet 131a and a heat receiving portion outlet 131b. The cooling liquid having a low temperature at the heat receiving portion inlet 131a flows into the heat-receiving tube 131 serving as a heat receiving portion through the heat receiving portion inlet 131a along a circulating direction 134. The heat-receiving tube 131 is in contact with a rear surface of the heat-radiating plate 20, and disposed to meander on the rear surface of the heat-radiating plate 20 as shown in FIG. 2.

The cooling liquid that has received the heat generated in the PDP 11 and the circuit board 19 via the heat-radiating plate 20 while passing through the heat-receiving tube 131 passes through the heat receiving portion outlet 131b and flows into the heat-radiating tube 132. In the present embodiment, when viewed from the display surface side of the PDP 11, substantially the entire heat-radiating tube 132 is located outside the peripheral edge 11a of the PDP 11 and is disposed along a side edge and an upper edge constituting the peripheral edge 11a of the PDP 11. Specifically, the heat-radiating tube 132 extends from the heat receiving portion outlet 131b toward one side edge (a side edge on the right in FIG. 2) of the PDP 11 to reach an inner surface of the housing 15 (the front cover 16 in the present embodiment), and then turns upward in the vertical direction along the side edge of the PDP 11 and further extends counterclockwise along the upper edge and another side edge (a side edge on the left in FIG. 2) of the PDP 11 while being in contact with the inner surface of the front cover 16, as shown in FIG. 2. The heat-radiating tube 132 enters inside the peripheral edge 11a of the PDP 11 again from a lower part of the left side edge of the PDP 11, and extends toward the heat receiving portion inlet 131a to be coupled to the heat-receiving tube 131. In this way, a continuous flow passage is formed.

By disposing the heat-radiating tube 132 as mentioned above, the heat can be radiated not by utilizing a rear portion of the PDP 11a, in which the temperature rises sharply during operation due to the reduced thickness of the apparatus, but by utilizing a region having a lower temperature than that of the rear portion (a region outside the peripheral edge 11a of the PDP 11). Thereby, satisfactory radiation properties can be obtained. Furthermore, disposing the heat-radiating tube 132 as mentioned above makes it possible to radiate heat efficiently and ensure a sufficient amount of heat radiation without increasing the length of the heat-radiating tube 132. This makes it unnecessary to ensure the thickness of the apparatus for accommodating the heat-radiating tube 132 with an increased length. As a result, the apparatus can be thinner.

In the present embodiment, substantially the entire heat-radiating tube 132 is located outside the peripheral edge 11a of the PDP 11. However, it is possible to attain the effective heat radiation that the present invention is intended to have and to suppress the increase in the apparatus thickness as long as at least a part of the heat-radiating tube 132 is located outside the peripheral edge 11a of the PDP 11.

Figure 7:
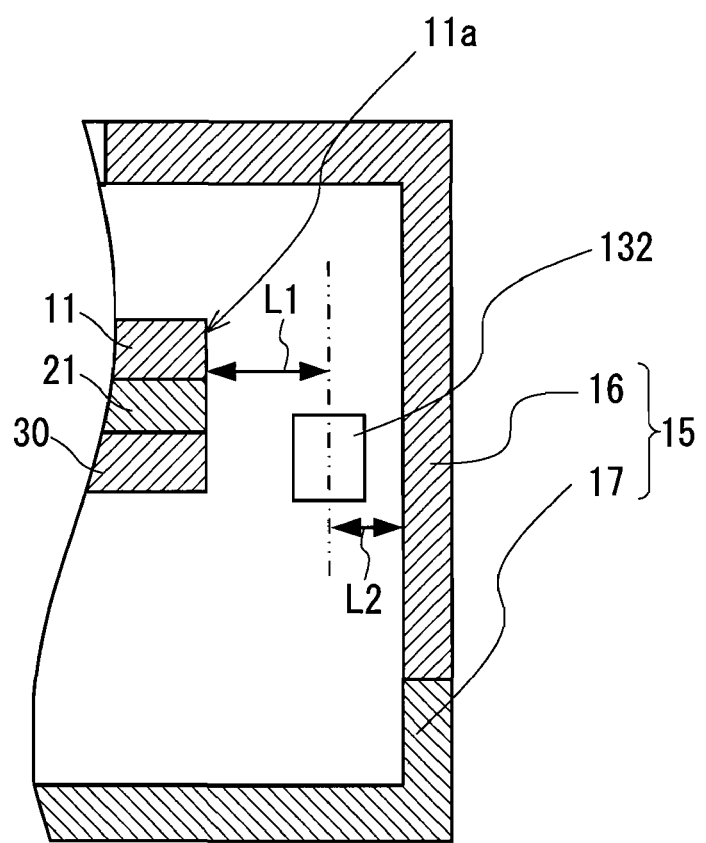
FIG. 7 is a drawing for describing a relationship between a distance from a heat-radiating tube to a peripheral edge of a PDP and a distance from a heat-radiating tube to an inner surface of a housing.
Figure 8:
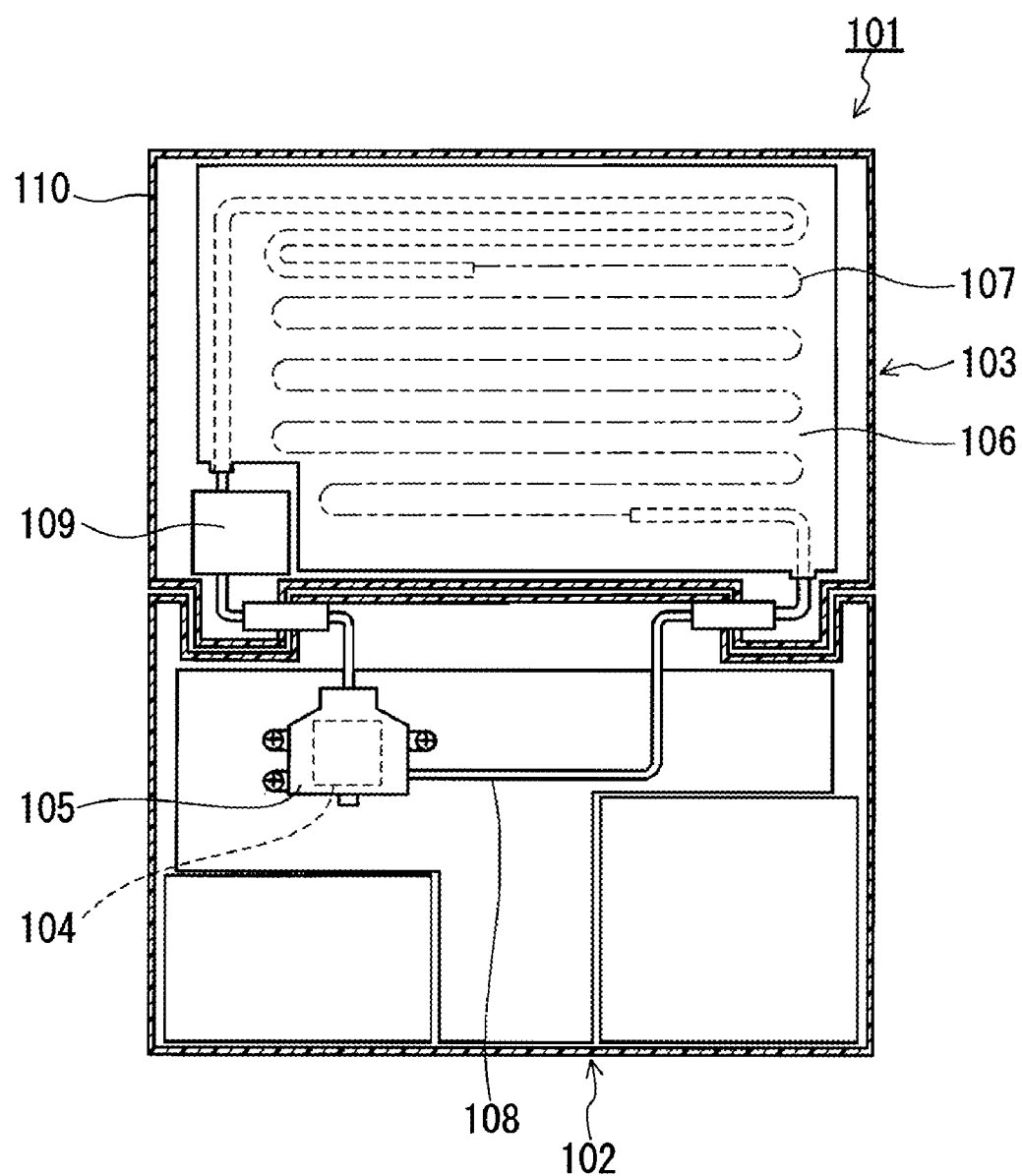
FIG. 8 is a cross-sectional view showing a radiation structure of a conventional image display apparatus.

The relative position of the heat-radiating tube with respect to the peripheral edge of the display device and the inner surface of the housing is not limited to the positions shown in FIG. 1 and FIG. 2 because the effective heat radiation that the present invention is intended to have can be attained as long as the at least a part of the heat-radiating tube is located outside the peripheral edge of the display device. However, in order to transfer the heat from the heat-radiating tube to the outside of the image display apparatus via the housing efficiently, the heat-radiating tube preferably is disposed so that a distance between the heat-radiating tube and the housing is shorter than a distance between the heat-radiating tube and the display device. More specifically, a relationship of L1>L2 preferably is satisfied, where L1 denotes a distance between the peripheral edge 11a of the PDP 11 serving as the display device and the heat-radiating tube 132, and L2 denotes a distance between the inner surface of the housing 15 and the heat-radiating tube 132, as shown in FIG. 7. As shown in FIGS. 1 and 2, the heat-radiating tube 132 is disposed so as to be in contact with the front cover 16 constituting the housing 15 in the present embodiment, but it may be spaced apart from the housing 15. In this case, the heat-radiating tube 132 preferably is disposed so that the distance between the heat-radiating tube 132 and the housing 15 is shorter than the distance between the heat-radiating tube 132 and the peripheral edge 11a of the PDP 11.

Furthermore, in order to transfer the heat more efficiently, it is more preferable for the at least a part of the heat-radiating tube to be in thermal communication with the housing, as in the heat-radiating tube 132 of the present embodiment (see FIG. 1 and FIG. 2). Here, the phrase "the heat-radiating tube is in thermal communication with the housing" is meant to include not only a structure in which the heat-radiating tube is in direct contact with the housing but also a structure in which the heat-radiating tube is in contact with the housing via a thermally conductive member.

In the image display apparatus of the present embodiment, it is preferable that the at least a part of the heat-radiating tube is located outside the side edge of the display device and is disposed along the side edge, and furthermore, the heat-radiating tube disposed along the side edge has a portion in which the cooling liquid is transported upward in the vertical direction. Since the heat moves upward in the vertical direction, the temperature of the image display apparatus is lowest at its lower portion. Thus, by arranging the heat-radiating tube as mentioned above, the cooling liquid having a temperature increased by receiving the heat can transfer the heat efficiently from the vertically lower portion having a relatively low temperature to the atmosphere and the housing. As a result, an even higher heat radiating effect can be obtained. In the image display apparatus 1 shown in FIG. 1 and FIG. 2, a part of the heat-radiating tube 132 extends upward in the vertical direction along one of the side edges (the side edge on the right in FIG. 2) of the PDP 11, and the cooling liquid inside thereof is transported upward in the vertical direction. Thereby, a high heat-radiating effect can be obtained.

As the cooling liquid, a liquid such as distilled water and a fluorine inert liquid (Fluorinert (registered trademark), for example) can be used. Generally, a liquid mixed with an antifreezing agent, such as propylene glycol, is used preferably.

The transporting pump 14 allows the cooling liquid to circulate through the tube 13. In the present embodiment, the cooling liquid circulates so as to realize the circulating direction 134 shown in FIG. 2.

The front cover 16 constituting the housing 15 can be formed of metal or resin. However, taking into consideration the fact that the heat is radiated via the front cover 16, it is preferable for the front cover 16 to be formed of metal. The front cover 16 is a rectangular frame having an opening at a center when viewed from the display surface side. The front cover 16 covers a peripheral portion of the front filter 18 from the front.

The back cover 17 constituting the housing 15 is formed by press-molding a metal plate, for example. The back cover 17 is disposed so as to cover the rear surface of the PDP 11, and is fixed to the chassis 12. In FIG. 1 and FIG. 2, in order to show the arrangement of the heat-radiating tube 132 simply, the attaching structure between the chassis 12 and the back cover 17 is not illustrated. The back cover 17 covers the circuit board 19. The back cover 17 has a ventilating hole (not shown) so that air can be exchanged between the outside and the inside of the back cover 17. The back cover 17 has conductivity and blocks electromagnetic waves emitted from the PDP 11, the circuit board 19, etc.

The front filter 18 is disposed in front of the PDP 11. The front filter 18 is constituted by a rectangular transparent substrate made of glass or a resin such as an acrylic resin, and various kinds of functional films formed on the transparent substrate. Specifically, examples of the functional film include an anti-reflection film, a colored film, a neon cut film, a near-infrared cut film, and a conductive film.

The heat-conducting sheet 21 is provided on almost an entire surface of the panel, between the rear surface of the PDP 11 and the front surface of the chassis 12. Generally, a material, such as silicone rubber, having flexibility and a relatively high thermal conductivity is used for the heat-conducting sheet 21. The heat-conducting sheet 21 also is adhesive on both sides and serves to hold the PDP 11 on the chassis 12.

As the circuit board 19, there can be mentioned, for example, an SUS board, a SCAN board, and a data control board for controlling image display, a tuner board for receiving images, a digital signal board for processing images, and a power supply circuit board for supplying electric power to an electric circuit and a device.

The heat-radiating plate 20 is held parallel to the circuit board 19 with a predetermined space therebetween on a back cover 17 side of the circuit board 19, and is in contact with high-heat-generating components, such as a capacitor, a power transistor, and a transformer, that are components mounted on the circuit board 19, via the heat-conducting sheet.

Next, the heat radiating operation of the image display apparatus 1 will be described.

The heat generated in the PDP 11 is transmitted to the heat-radiating plate 20 via the heat-conducting sheet 21 and the chassis 12. The heat generated in the circuit board 19 also is transmitted to the heat-radiating plate 20. These heats raise the temperature of the heat-radiating plate 20. The cooling liquid absorbs the heat from the heat-radiating plate 20 while passing through the heat-receiving tube 131 disposed so as to be in contact with a back cover 17 side surface of the heat-radiating plate 20.

The cooling liquid has a low temperature at the heat receiving portion inlet 131a serving as an entrance of the heat-receiving tube 131. The temperature of the cooling liquid rises while the cooling liquid passes through the heat-receiving tube 131, and it is highest at the heat receiving portion outlet 131b serving as an exit of the heat-receiving tube 131.

The cooling liquid with an increased temperature passes through the heat receiving portion outlet 131b and enters into the heat-radiating tube 132. The heat-radiating tube 132 is disposed in a plane parallel to the PDP 11 from and beyond the heat receiving portion outlet 131b.

The cooling liquid with an increased temperature diffuses heat into the atmosphere by radiation and also transfers the heat to the front cover 16, while passing through the heat-radiating tube 132 that is in contact with the inner surface of the front cover 16 constituting the housing 15 and disposed outside the peripheral edge 11a of the PDP 11. The heat that has been transferred to the front cover 16 is diffused inside of the front cover 16 by heat conduction, and also diffused from a surface of the front cover 16 into the atmosphere by radiation.

Since the heat diffusion as mentioned above is performed over a long passage of an entire side surface of the front cover 16, a large amount of heat can be diffused. Accordingly, the temperature of the cooling liquid becomes lowest when it reaches the heat receiving portion inlet 131a.

The amount of heat radiation increases when the passage of the heat-radiating tube 132 disposed outside the peripheral edge 11a of the PDP 11 becomes longer. Accordingly, the heat radiating effect to be obtained by the configuration of the present embodiment is enhanced when the image display apparatus 1 has a larger screen.

Embodiment 2

Embodiment 2 describes another example of the configuration of the present invention by referring to a plasma display as an example of the image display apparatus.

Figure 3:
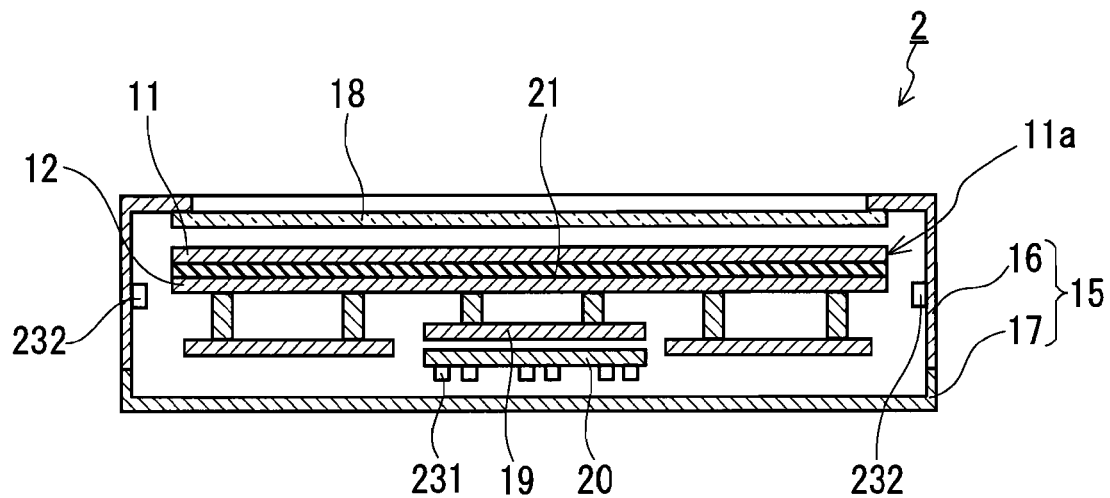
FIG. 3 is a cross-sectional view of an image display apparatus of Embodiment 2 of the present invention, which has been cut perpendicularly with respect to a display surface of a display device at the middle along a horizontal direction.
Figure 4:
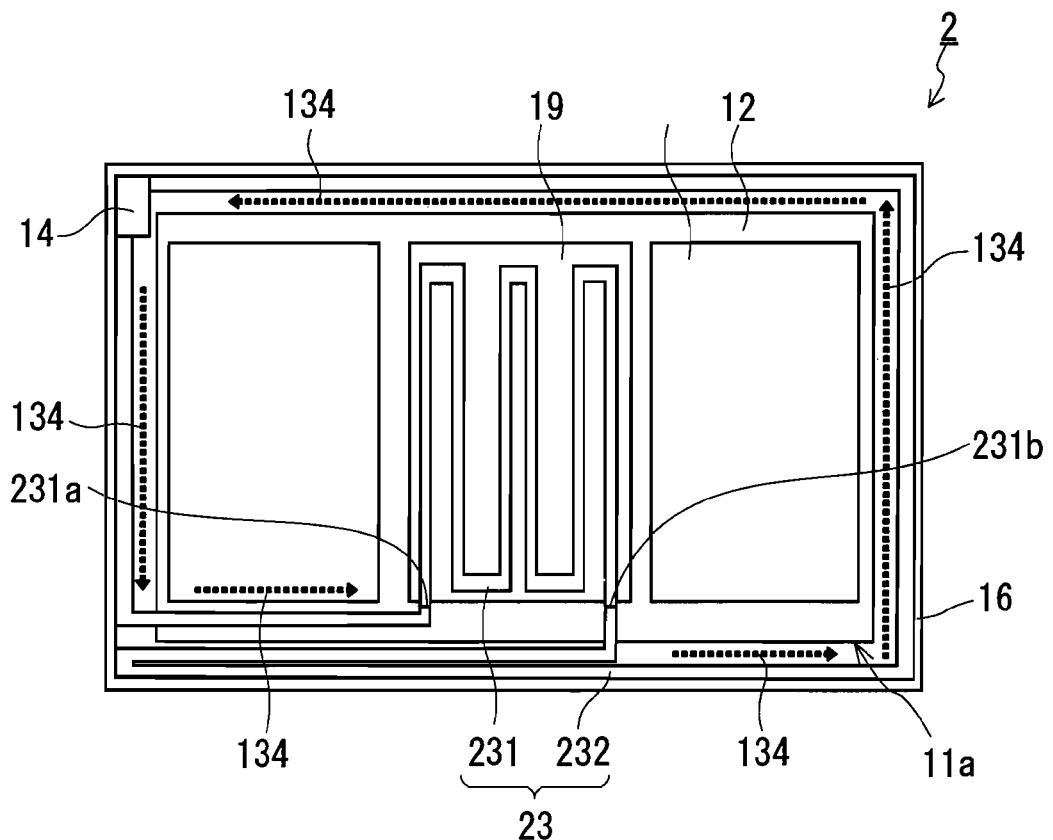
FIG. 4 is a rear view of the image display apparatus of the Embodiment 2 of the present invention.

FIG. 3 is a cross-sectional view of an image display apparatus 2 of the present embodiment, which has been cut perpendicularly with respect to the display surface of the PDP (display device) at the middle along the horizontal direction. FIG. 4 is a rear view of the image display apparatus 2 of the present embodiment from which a back cover is omitted.

The image display apparatus 2 of the present embodiment has the same configuration as that of the image display apparatus 1 of the Embodiment 1 except for the arrangement of the tube. Thus, the description except for that about the tube will be omitted in the present embodiment.

A tube 23 is constituted by a heat-receiving tube 231 and a heat-radiating tube 232. The heat-receiving tube 231 and the heat-radiating tube 232 are coupled to each other at a heat receiving portion inlet 231a and a heat receiving portion outlet 231b to form a continuous flow passage. Since the tube 23 of the present embodiment is the same as the tube 13 described in the Embodiment 1 except for the arrangement of the heat-radiating tube 232, only the features of the arrangement of the heat-radiating tube 232 will be described here.

In the present embodiment, when viewed from the display surface side of the PDP 11, substantially the entire heat-radiating tube 232 is located outside the peripheral edge 11a of the PDP 11. The heat-radiating tube 232 coupled to the heat receiving portion outlet 231b extends outside the peripheral edge 11a of the PDP 11 from a lower edge of the PDP 11, and further is disposed along the lower edge, one of the side edges, the upper edge, and the other side edge of the PDP 11 so that the cooling liquid can flow counterclockwise as in FIG. 4. Specifically, the heat-radiating tube 232 extends toward the lower edge of the PDP 11 from the heat receiving portion outlet 231b, goes beyond the lower edge to come out of the peripheral edge 11a of the PDP 11, extends to reach one of the side inner surfaces (the side inner surface on the left in FIG. 4) of the housing 15 (the front cover 16 in the present embodiment) along the lower edge of the PDP 11, turns back, extends to reach the other side inner surface (the side inner surface on the right in FIG. 4) while being in contact with a lower inner surface of the housing 15, and further extends counterclockwise while being in contact with the right side inner surface, an upper inner surface, and the left side inner surface of the front cover 16. The heat-radiating tube 232 enters inside the peripheral edge 11a of the PDP 11 again from the lower part of the left side edge of the PDP 11, and extends toward the heat receiving portion inlet 231a to be coupled to the heat-receiving tube 231. In this way, a continuous flow passage is formed.

As in the Embodiment 1, by disposing the heat-radiating tube 232 as mentioned above, the heat can be radiated not by utilizing the rear portion of the PDP 11a, in which the temperature rises sharply during operation due to the reduced thickness of the apparatus, but by utilizing the region having a lower temperature than that of the rear portion (the region outside the peripheral edge 11a of the PDP 11). Thereby, satisfactory radiation properties can be obtained. Furthermore, disposing the heat-radiating tube 232 as mentioned above makes it possible to perform an efficient heat radiation and ensure a sufficient amount of heat radiation without increasing the length of the heat-radiating tube 232. This makes it unnecessary to ensure the thickness of the apparatus for accommodating the heat-radiating tube 232 with an increased length. As a result, the apparatus can be thinner.

In the case where at least a part of the heat-radiating tube 232 is located lower than the lower edge of the PDP 11 and is disposed along the lower edge when viewed from the display surface side of the display device as in the present embodiment, heat can be radiated efficiently at the lower portion of the PDP 11 having a relatively low temperature. Moreover, since the temperature at the lower portion of the PDP 11 is relatively low, there is a wide gap until the temperature reaches a point dangerous for a user touching the apparatus. Thus, the lower portion of the PDP 11 can be an effective heat radiating portion also from the safety point of view. Furthermore, even when the temperature at the lower portion of the PDP 11 rises, it is relatively difficult for the user to touch the lower portion of the image display apparatus when the image display apparatus is used in a stationary manner. Thus, more enhanced safety can be attained.

When viewed from the display surface side of the PDP 11, the heat-radiating tube 232 is disposed so that the cooling liquid inside thereof is transported outside the peripheral edge 11a of the PDP 11 from the lower edge of the PDP 11. Thereby, the cooling liquid having a temperature increased by receiving the heat can radiate the heat from the lower portion of the PDP 11 having a relatively low temperature.

In the present embodiment, substantially the entire heat-radiating tube 232 is located outside the peripheral edge 11a of the PDP 11. It is possible, however, to achieve the effective heat radiation that the present invention is intended to have and suppress the increase in the apparatus thickness as long as at least a part of the heat-radiating tube 232 is located outside the peripheral edge 11a of the PDP 11.

As described in the Embodiment 1, it also is preferable in the image display apparatus of the present embodiment that the heat-radiating tube is disposed so that the distance between the heat-radiating tube and the housing is shorter than the distance between the heat-radiating tube and the display device. In the present embodiment, the heat-radiating tube 232 is disposed so as to be in contact with the front cover 16 constituting the housing 15, but it may be spaced apart from the housing 15. In this case, the heat-radiating tube 232 preferably is disposed so that a distance between the heat-radiating tube 232 and the housing 15 is shorter than a distance between the heat-radiating tube 232 and the peripheral edge 11a of the PDP 11.

In the image display apparatus 2 of the present embodiment, a part of the heat-radiating tube 232 extends upward in the vertical direction along one of the side edges (the side edge on the right in FIG. 4) of the PDP 11, and the cooling liquid inside thereof is transported upward in the vertical direction. Thus, a high heat radiating effect can be obtained as in the Embodiment 1.

The heat radiating operation of the image display apparatus 2 of the present embodiment will be described.

As in the Embodiment 1, the heats generated in the PDP 11 and the circuit board 19 are transmitted to the cooling liquid in the heat-receiving tube 231, and the cooling liquid with an increased temperature enters into the heat-radiating tube 232.

The heat-radiating tube 232 is disposed in a plane parallel to the PDP 11 from and beyond the heat receiving portion outlet 231b. As described above, the cooling liquid that has entered into the heat-radiating tube 232 through the heat receiving portion outlet 231b diffuses the heat into the atmosphere by radiation, and also transfers the heat to the front cover 16 while passing through the heat-radiating tube 232. The heat that has been transferred to the front cover 16 is diffused inside the front cover 16 by heat conduction, and also diffused from the surface of the front cover 16 into the atmosphere by radiation.

In the present embodiment, it is important that the heat-radiating tube 232 is disposed so that the cooling liquid with an increased temperature is brought into thermal communication with a lower inner surface of the front cover 16 immediately after the cooling liquid flows into the heat-radiating tube 232 through the heat receiving portion outlet 231b. This is because since the heat moves upward in the vertical direction, the temperature of the front cover 16 is lowest at its lower portion. The lower portion of the front cover 16 is a portion that the user is most unlikely to touch when compared with an upper portion and side portions, so it is an effective heat radiation portion also from the safety point of view.

The amount of heat radiation increases when the passage of the heat-radiating tube 232 disposed outside the peripheral edge 11a of the PDP 11 becomes longer. Accordingly, the heat radiating effect to be obtained by the configuration of the present embodiment is enhanced when the image display apparatus 2 has a larger screen.

Embodiment 3

Embodiment 3 describes still another example of the configuration of the present invention by referring to a plasma display as an example of the image display apparatus.

Figure 5:
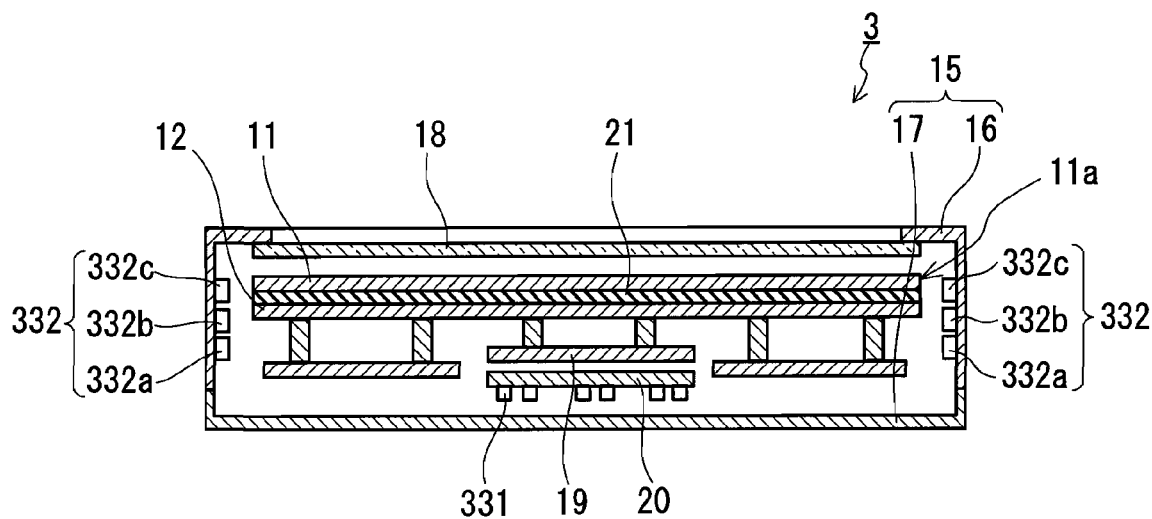
FIG. 5 is a cross-sectional view of an image display apparatus of Embodiment 3 of the present invention, which has been cut perpendicularly with respect to a display surface of a display device at the middle along a horizontal direction.
Figure 6:
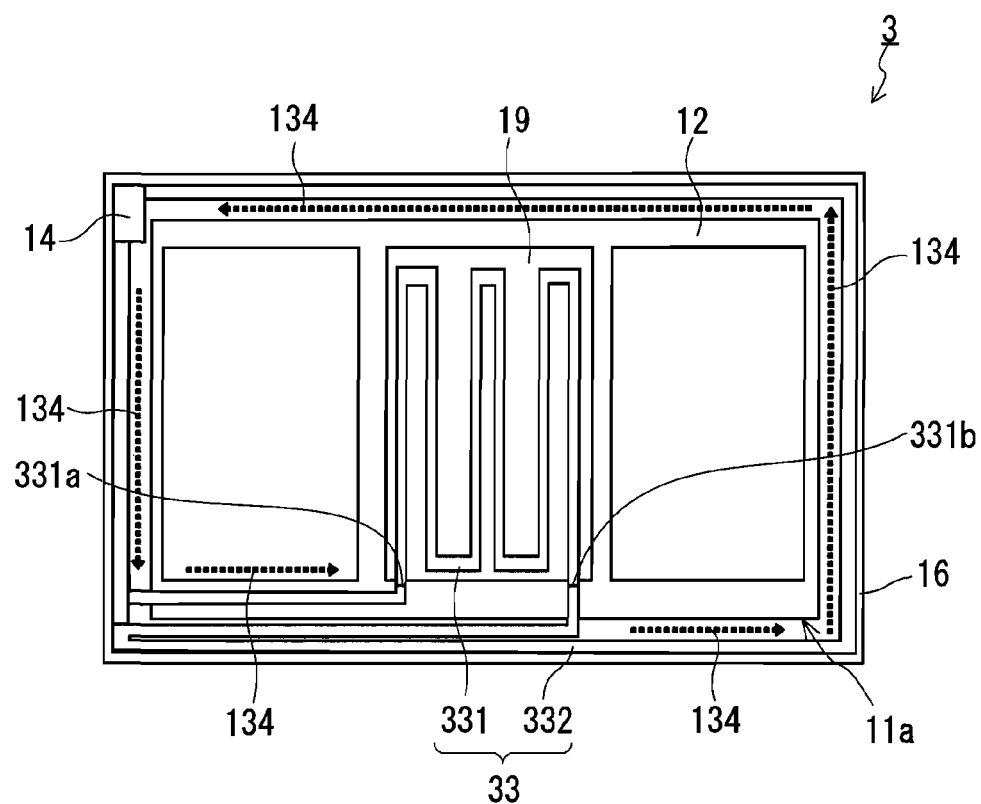
FIG. 6 is a rear view of the image display apparatus of the Embodiment 3 of the present invention.

FIG. 5 is a cross-sectional view of an image display apparatus 3 of the present embodiment, which has been cut perpendicularly with respect to the display surface of the PDP (display device) at the middle along the horizontal direction. FIG. 6 is a rear view of the image display apparatus 3 of the present embodiment from which a back cover is omitted.

The image display apparatus 3 of the present embodiment has the same configuration as that of the image display apparatus 1 of the Embodiment 1 except for the arrangement of the tube. Thus, the description except for that about the tube will be omitted in the present embodiment.

A tube 33 is constituted by a heat-receiving tube 331 and a heat-radiating tube 332. The heat-receiving tube 331 and the heat-radiating tube 332 are coupled to each other at a heat receiving portion inlet 331a and a heat receiving portion outlet 331b to form a continuous flow passage. Since the tube 33 of the present embodiment is the same as the tube 13 described in the Embodiment 1 except for the arrangement of the heat-radiating tube 332, only features of the arrangement of the heat-radiating tube 332 will be described here.

In the present embodiment, substantially the entire heat-radiating tube 332 is located outside the peripheral edge 11a of the PDP 11. When viewed from the display surface side of the PDP 11, the heat-radiating tube 332 is disposed in a plurality of rows (three rows in the present embodiment) in a depth direction, and in the part of the heat-radiating tube 332 disposed in the plurality of rows, the cooling liquid inside thereof is transported from the heat-radiating tube disposed farther (on a rear surface side) from the display surface side to the heat-radiating tube disposed closer (on a front surface side) to the display surface side.

A heat-radiating tube 332a disposed farthest from the display surface side is coupled to the heat receiving portion outlet 331b, extends from the heat receiving portion outlet 331b toward the lower edge of the PDP 11, goes beyond the lower edge to come out of the peripheral edge 11a of the PDP 11, extends to reach one of the side inner surfaces (the side inner surface on the left in FIG. 6) of the housing 15 (the front cover 16 in the present embodiment) along the lower edge of the PDP 11, turns back, and extends to reach the other side inner surface (the side inner surface on the right in FIG. 6) while being in contact with the lower inner surface of the front cover 16, and further extends counterclockwise while being in contact with the right side inner surface, the upper inner surface, and the left side inner surface of the front cover 16. Then, the tube makes this turn two times continuously, extending from the back cover 17 side (farther side) of the front cover 16 toward a PDP 11 side (closer side) of the front cover 16. Thereby, heat-radiating tubes 332b and 332c are disposed closer to the display surface side than the heat-radiating tube 332a. The heat-radiating tube 332c disposed closest to the display surface side enters inside the peripheral edge 11a of the PDP 11 again from the lower part of the left side edge of the PDP 11, and extends toward the heat receiving portion inlet 331a to be coupled to the heat-receiving tube 331. In this way, a continuous flow passage is formed.

As in the Embodiment 1, by disposing the heat-radiating tube 332 as mentioned above, the heat can be radiated not by utilizing the rear portion of the PDP 11a, in which the temperature rises sharply during operation due to the reduced thickness of the apparatus, but by utilizing the region having a lower temperature than that of the rear portion (a region outside the peripheral edge 11a of the PDP 11). Thereby, satisfactory radiation properties can be obtained. Furthermore, by disposing the heat-radiating tube 332 so as to utilize the region outside the peripheral edge 11a of the PDP 11, it is possible to obtain a thin apparatus without increasing the thickness thereof even when the number of the turns that the heat-radiating tube 332 makes is increased and the passage of the heat-radiating tube 332 becomes longer.

As described in the Embodiment 1, it is preferable also in the image display apparatus of the present embodiment that the heat-radiating tube is disposed so that the distance between the heat-radiating tube and the housing is shorter than the distance between the heat-radiating tube and the display device. In the image display apparatus 3 shown in FIG. 5 and FIG. 6, the heat-radiating tube 332 is disposed so as to be in contact with the front cover 16 constituting the housing 15, but it may be spaced apart from the housing 15. In this case, the heat-radiating tube 332 preferably is disposed so that a distance between the heat-radiating tube 332 and the housing 15 is shorter than a distance between the heat-radiating tube 332 and the peripheral edge 11a of the PDP 11.

Next, the heat radiating operation of the image display apparatus 3 of the present embodiment will be described.

As in the Embodiment 1, the heats generated in the PDP 11 and the circuit board 19 are transmitted to the cooling liquid in the heat-receiving tube 331, and the cooling liquid with an increased temperature enters into the heat-radiating tube 332a.

The heat-radiating tube 332a is disposed in a plane parallel to the PDP 11 from and beyond the heat receiving portion outlet 331b. The cooling liquid that has entered into the heat-radiating tube 332a through the heat receiving portion outlet 331b diffuses the heat into the atmosphere by radiation and also transfers the heat to the front cover 16 while passing through the heat-radiating tube 332a, 332b, and 332c disposed as described above. The heat that has been transferred to the front cover 16 is diffused inside of the front cover 16 by heat conduction, and also diffused from the surface of the front cover 16 into the atmosphere by radiation.

In the image display apparatus 3 of the present embodiment, since the long passage of the entire side surface of the front cover 16 is utilized for making the three turns for radiating the heat, a large amount of heat can be diffused. Accordingly, the temperature of the cooling liquid becomes lowest when the cooling liquid reaches the heat receiving portion inlet 331a.

The amount of heat radiation increases when the passage of the heat-radiating tube 332 disposed outside the peripheral edge 11a of the PDP 11 becomes longer. Accordingly, the heat radiating effect to be obtained is enhanced when the image display apparatus 3 has a larger screen. Moreover, when the number of the turns that the heat-radiating tube 332 makes along the inner surface of the front cover 16 increases, the temperature and the amount of heat radiation become uniform, making it possible to suppress the generation of high temperature spots.

As in the Embodiment 2, the present embodiment has a configuration in which the cooling liquid with an increased temperature is brought into thermal communication with the lower inner surface of the front cover 16 immediately after the cooling liquid flows into the heat-radiating tube 332a through the heat receiving portion outlet 331b. Thus, satisfactory effects can be obtained from the view points of radiation efficiency and safety as in the Embodiment 2.

Other Embodiments

The tube is disposed counterclockwise around the PDP in the Embodiments 1 to 3. The direction, however, is not limited to this and may be disposed clockwise.

In order to accelerate the heat radiation from the front cover, the front cover further may be provided with a shape of a radiation fin. It is most effective to have it on an outer periphery of the front cover.

In each of the embodiments mentioned above, descriptions are made with respect to the configuration in which the interior of the image display apparatus is cooled only by natural convection through the ventilating hole without using a fan. However, the present invention is not limited to this, and the same effects can obtained even with a configuration in which the air inside of the rear cover is taken out by using a fan.

The description is made by referring to the PDP as an example of the display device in each of the above-mentioned embodiments, but it is applicable to liquid crystal displays, EL displays, etc.

The specific numerical values used in each of the above-mentioned embodiments merely are examples, and they can be set to optimal values appropriately in accordance with the characteristics of the display device, the specifications of the image display apparatus, etc.

Features of the Embodiments

Features of the Embodiments are Listed Hereinafter. Features of the embodiments are not limited to these.

(1)

An image display apparatus of the present invention includes:

a display device for displaying an image;

a heat-receiving tube that is disposed so as to be in thermal communication with the display device and is filled with a cooling liquid;

a heat-radiating tube that is provided to be continuous with the heat-receiving tube and is filled with the cooling liquid; and a transporting pump allowing the cooling liquid to circulate through the heat-receiving tube and the heat-radiating tube.

When viewed from a display surface side of the display device, at least a part of the heat-radiating tube is located outside a peripheral edge of the display device and is disposed along the peripheral edge.

(2)

The image display apparatus may further include a housing accommodating the display device, the heat-receiving tube, and the heat-radiating tube.

The image display apparatus may have a configuration in which:

when viewed from the display surface side of the display device, the at least a part of the heat-radiating tube is disposed between the peripheral edge of the display device and an inner surface of the housing; and a relationship of L1>L2 is satisfied, where L1 denotes a distance between the peripheral edge of the display device and the heat-radiating tube, and L2 denotes a distance between the inner surface of the housing and the heat-radiating tube.

(3)

The image display apparatus may have a configuration in which the at least a part of the heat-radiating tube is in thermal communication with the housing.

(4)

The image display apparatus may have a configuration in which:

the peripheral edge of the display device is constituted by an upper edge, a lower edge, and a side edge;

when viewed from the display surface side of the display device, the at least a part of the heat-radiating tube is located outside the side edge of the display device and is disposed along the side edge; and the heat-radiating tube disposed along the side edge has a portion in which the cooling liquid is transported upward in a vertical direction.

(5)

The image display apparatus may have a configuration in which:

the peripheral edge of the display device is constituted by an upper edge, a lower edge, and a side edge; and when viewed from the display surface side of the display device, the at least a part of the heat-radiating tube is located lower than the lower edge of the display device and is disposed along the lower edge.

(6)

The image display apparatus may have a configuration in which;

when viewed from the display surface side of the display device, the heat-radiating tube is disposed so that the cooling liquid inside thereof is transported outside the peripheral edge of the display device from the lower edge of the display device.

(7)

The image display apparatus may have a configuration in which;

when viewed from the display surface side of the display device, the at least a part of the heat-radiating tube is disposed in a plurality of rows in a depth direction; and in the part of the heat-radiating tube disposed in the plurality of rows, the cooling liquid inside thereof is transported from the heat-radiating tube disposed farther from the display surface side to the heat-radiating tube disposed closer to the display surface side.

(8)

The image display apparatus may have a configuration in which when viewed from the display surface side of the display device, substantially the entire heat-radiating tube is located outside the peripheral edge of the display device and is disposed along the peripheral edge.

The above-mentioned embodiments are examples of the present invention. The present invention is not limited to these embodiments and can be modified variously. Needless to say, those modified also are included within the scope of the present invention.

The image display apparatus of the present invention has the effect of lowering the temperature of the display device (such as PDP) effectively, and is useful as an image display apparatus such as one with a thin large screen.

The specific embodiments or examples described in the section of "DETAILED DESCRIPTION OF THE INVENTION" are intended only to clarify the technical contents of the present invention and the present invention should not be interpreted narrowly as limiting to such specific examples alone. They can be embodied by being modified variously within the spirit of the present invention and the range of patent claims to be described next.

What is claimed is:

1. An image display apparatus comprising:
a display device for displaying an image;
a chassis for supporting the display device;
a circuit board attached to a rear surface of the chassis;
a housing that is constituted by a front cover and a back cover and covers the display device, the chassis, and the circuit board;
a heat-radiating plate disposed in the housing so as to face the circuit board;
a heat-receiving tube disposed so as to be in contact with the heat-radiating plate and filled with a cooling liquid;
a heat-radiating tube that is provided to be continuous with the heat-receiving tube and is filled with the cooling liquid; and
a transporting pump allowing the cooling liquid to circulate through the heat-receiving tube and the heat-radiating tube,
wherein when viewed from a display surface side of the display device, at least a part of the heat-radiating tube is located outside a peripheral edge of the display device and is disposed along the peripheral edge.

* * * * *